(12) United States Patent
Reznicek et al.

(10) Patent No.: US 11,081,542 B2
(45) Date of Patent: Aug. 3, 2021

(54) BURIED MIM CAPACITOR STRUCTURE WITH LANDING PADS

(71) Applicant: International Business Machines Corporation, Armonk, NY (US)

(72) Inventors: Alexander Reznicek, Troy, NY (US); Praneet Adusumilli, Somerset, NJ (US); Oscar van der Straten, Guilderland Center, NY (US); Joshua Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/710,781

(22) Filed: Dec. 11, 2019

(65) Prior Publication Data
US 2020/0119136 A1 Apr. 16, 2020

Related U.S. Application Data

(62) Division of application No. 15/854,465, filed on Dec. 26, 2017, now Pat. No. 10,546,915.

(51) Int. Cl.
| H01L 49/02 | (2006.01) |
| H01L 23/535 | (2006.01) |
| H01L 21/768 | (2006.01) |
| H01L 27/06 | (2006.01) |
| H01L 27/108 | (2006.01) |

(Continued)

(52) U.S. Cl.
CPC ........ H01L 28/60 (2013.01); H01L 21/76895 (2013.01); H01L 23/5222 (2013.01); H01L 23/535 (2013.01); H01L 27/0629 (2013.01); H01L 27/10805 (2013.01); H01L 28/87 (2013.01); H01L 28/91 (2013.01); H01L 29/0649 (2013.01)

(58) Field of Classification Search
CPC . H01L 28/60; H01L 21/76895; H01L 23/535; H01L 27/0629; H01L 27/10805; H01L 23/5222; H01L 28/87; H01L 28/91
See application file for complete search history.

(56) References Cited

U.S. PATENT DOCUMENTS

| 5,286,670 A | 2/1994 | Kang et al. |
| 7,202,126 B2 | 4/2007 | Kiyotoshi |

(Continued)

FOREIGN PATENT DOCUMENTS

| CN | 101174640 A | 5/2008 | |
| WO | 2014083924 A1 | 6/2014 | |
| WO | WO-2014083924 A1 * | 6/2014 | ....... H01L 21/28568 |

OTHER PUBLICATIONS

List of IBM Patents or Patent Applications Treated as Related Dated Dec. 11, 2019, 2 Pages.

*Primary Examiner* — Peter Bradford
(74) *Attorney, Agent, or Firm* — Scully, Scott, Murphy & Presser, P.C.; Randall Bluestone

(57) ABSTRACT

A buried metal-insulator-metal (MIM) capacitor with landing pads is formed between first and second semiconductor substrates. The landing pads provide increased area for contacting which may decrease the contact resistors of the capacitor. The area of the buried MIM capacitor can be varied to provide a tailored capacitance. The buried MIM capacitor is thermally stable since the MIM capacitor includes refractory metal or metal alloy layers as the capacitor plates.

20 Claims, 10 Drawing Sheets

(51) Int. Cl.
*H01L 29/06* (2006.01)
*H01L 23/522* (2006.01)

(56) References Cited

U.S. PATENT DOCUMENTS

| | | |
|---|---|---|
| 7,851,321 B2 | 12/2010 | Clevenger et al. |
| 9,231,046 B2 | 1/2016 | Daubenspeck et al. |
| 9,331,137 B1 | 5/2016 | Ratakonda et al. |
| 9,876,068 B1 | 1/2018 | Yang |
| 2003/0027385 A1 | 2/2003 | Park et al. |
| 2004/0113190 A1 | 6/2004 | Oh et al. |
| 2005/0012125 A1 | 1/2005 | Summerfelt et al. |
| 2005/0067701 A1 | 3/2005 | Coolbaugh et al. |
| 2005/0118762 A1 | 6/2005 | Nakamura et al. |
| 2005/0170583 A1 | 8/2005 | Park |
| 2005/0247968 A1* | 11/2005 | Oh .................... H01L 28/40 257/306 |
| 2006/0134879 A1* | 6/2006 | Kim .................. H01L 23/5223 438/393 |
| 2006/0157766 A1 | 7/2006 | Won et al. |
| 2006/0197183 A1 | 9/2006 | Yang et al. |
| 2007/0037363 A1 | 2/2007 | Aspar et al. |
| 2007/0037405 A1 | 2/2007 | Kim et al. |
| 2007/0069384 A1 | 3/2007 | Watanabe |
| 2007/0173029 A1 | 7/2007 | Abadeer et al. |
| 2007/0296085 A1 | 12/2007 | Coolbaugh et al. |
| 2008/0157276 A1 | 7/2008 | Park |
| 2009/0200638 A1 | 8/2009 | Smith |
| 2010/0129978 A1 | 5/2010 | Kim |
| 2010/0219502 A1 | 9/2010 | Shieh et al. |
| 2011/0284991 A1 | 11/2011 | Hijioka et al. |
| 2014/0291805 A1* | 10/2014 | Hong ................. H01L 23/5223 257/532 |
| 2015/0048483 A1 | 2/2015 | Kuo et al. |
| 2015/0061134 A1 | 3/2015 | Lee et al. |
| 2015/0102459 A1 | 4/2015 | Lai et al. |
| 2015/0364474 A1* | 12/2015 | Kang .................. G11C 11/5635 257/306 |
| 2016/0233158 A1* | 8/2016 | Jen ..................... H01L 23/5223 |
| 2017/0069633 A1 | 3/2017 | Kim et al. |
| 2017/0250159 A1* | 8/2017 | Lee ..................... H01L 23/481 |
| 2018/0190761 A1* | 7/2018 | Chiang ................. H01L 28/90 |

* cited by examiner

BURIED MIM CAPACITOR STRUCTURE WITH LANDING PADS

BACKGROUND

The present application relates to a semiconductor structure and a method of forming the same. More particularly, the present application relates to a semiconductor structure including a thermally stable buried metal-insulator-metal (MIM) capacitor with landing pads that is formed on a bulk semiconductor substrate.

A capacitor is a passive two-terminal electrical component that stores electrical energy in an electric field. A capacitor is a component designed to add capacitance to a circuit. Capacitors are widely used in electronic circuits for blocking direct current while allowing alternating current to pass.

Metal-insulator-metal (MIM) capacitors are one type of capacitor design that is valuable in many applications. For example, MIM capacitors can be used in radio frequency (RF) circuits, in various configurations in analog integrated circuits (ICs), and for decoupling capacitance in high power microprocessor units (MPUs). MIM capacitors are useful in dynamic access random memory (DRAM) cells. As such, there is a need for providing MIM capacitors that are thermally stable and which can have a tailored capacitance.

Furthermore, and in conventional MIM capacitors, the metal layers of the capacitor are very thin and hard to contact. Hence, there is also a need for providing MIM capacitors in which larger bulk areas are provided for contacting.

SUMMARY

A buried metal-insulator-metal (MIM) capacitor with landing pads is formed between first and second semiconductor substrates. The landing pads provide increased area for contacting which may decrease the contact resistors of the capacitor. The area of the buried MIM capacitor can be varied to provide a tailored capacitance. The buried MIM capacitor is thermally stable since the MIM capacitor includes refractory metal or metal alloy layers as the capacitor plates.

In one aspect of the present application, a semiconductor structure containing a thermally stable MIM capacitor with landing pads is provided. In one embodiment, the semiconductor structure may include a first oxide layer located on a semiconductor substrate. A metal-insulator-metal (MIM) capacitor is located on the first oxide layer. The MIM capacitor includes a first refractory metal or metal alloy layer, a dielectric material layer, and a second refractory metal or metal alloy layer. A second oxide layer is located above the MIM capacitor. A semiconductor material device layer is located on the second oxide layer. In accordance with the present application, the first oxide layer includes a first landing pad embedded therein, and the second oxide layer includes a second landing pad embedded therein. The landing pads are composed of a refractory metal or metal alloy.

In another aspect of the present application, a method of forming a semiconductor structure containing a thermally stable MIM capacitor with landing pads is provided. In one embodiment, the method may include providing a first structure that includes a first oxide layer located on a surface of a first semiconductor substrate, the first oxide layer having an opening located therein, and a first refractory metal or metal alloy layer located above the first oxide layer and filling the opening. A second structure is also provided that includes a second semiconductor substrate, a second oxide layer is located on the second semiconductor substrate and having an opening located therein, and a second refractory metal or metal alloy layer above the second oxide layer and filling the opening. In the present application, a dielectric material layer is present on at least one of the first refractory metal or metal alloy layer and the second refractory metal or metal alloy layer. Next, the first and second structures are bonded together such that the second semiconductor substrate has a physically exposed surface. A portion of the second semiconductor substrate is then removed. Next, first and second trench isolation structures are formed extending from a topmost surface of a remaining portion of the second semiconductor substrate and contacting a surface of the first semiconductor substrate.

In another embodiment, the method may include providing a first structure that includes a first oxide layer located on a surface of a first semiconductor substrate, the first oxide layer having an opening located therein, a first refractory metal or metal alloy layer is located above the first oxide layer and filling the opening, and a first dielectric material layer is located on the first refractory metal or metal alloy layer. A second refractory metal or metal alloy layer is then formed on the first dielectric material layer. A second oxide layer is formed above the second refractory metal or metal alloy layer, wherein the second oxide layer has a refractory metal or metal alloy structure embedded therein. A second structure is provided than includes a second semiconductor substrate. The first and second structures are bonded together. Next, a portion of the second semiconductor substrate is removed. Next, first and second trench isolation structures are formed extending from a topmost surface of a remaining portion of the second semiconductor substrate and contacting a surface of the first semiconductor substrate.

liner and a second dielectric material layer located on the second metal-containing liner.

Figure 5:
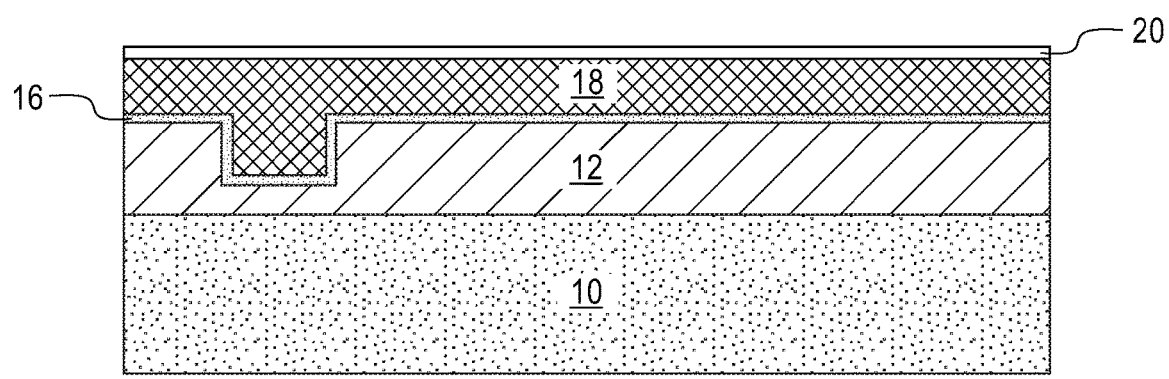
FIG. 5 is a cross sectional view of the exemplary semiconductor structure of FIG. 4 after forming a first dielectric material layer on the first refractory metal or metal alloy layer.
Figure 6:
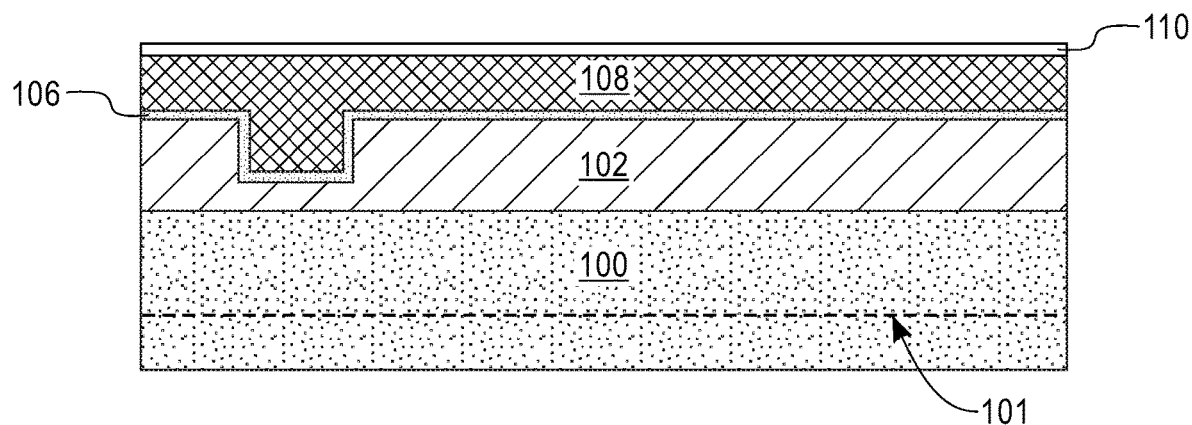
FIG. 6 is a cross sectional view of another exemplary semiconductor structure that includes a second semiconductor substrate having a hydrogen implant region located therein, a second oxide layer located on the second semiconductor substrate, the second oxide layer having an opening therein, a second metal-containing liner on the second oxide layer and within the opening, a second refractory metal or metal alloy layer on the second metal-containing"
Figure 7:
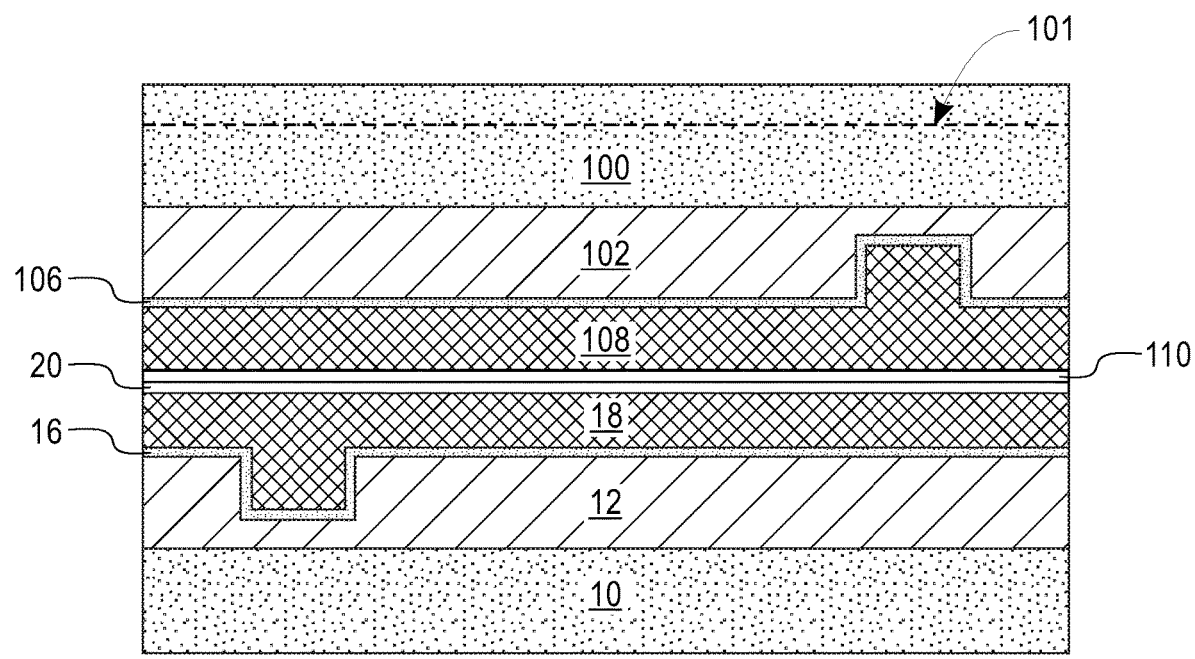

FIG. 7 is a cross sectional view of the exemplary semiconductor structures of FIGS. 5-6 after bonding the two exemplary structures together.

Figure 8:
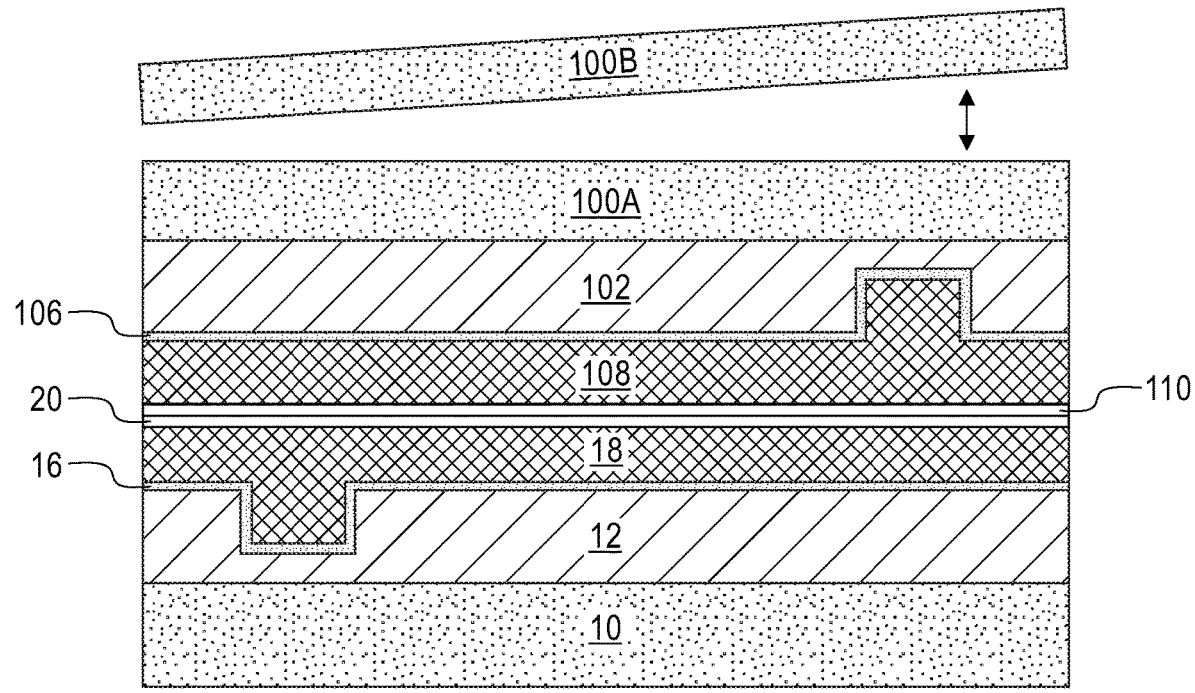

FIG. 8 is a cross sectional view of the exemplary bonded semiconductor structure of FIG. 7 during the removal of an upper portion of the second semiconductor substrate that includes the hydrogen implant region.

Figure 9:
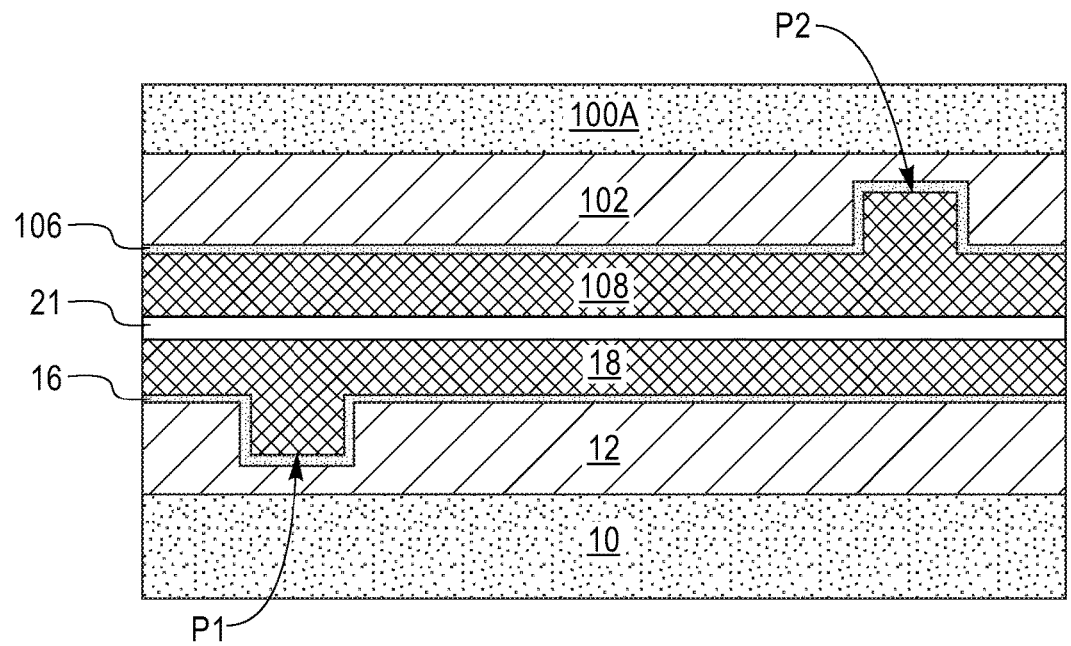
Figure 10:
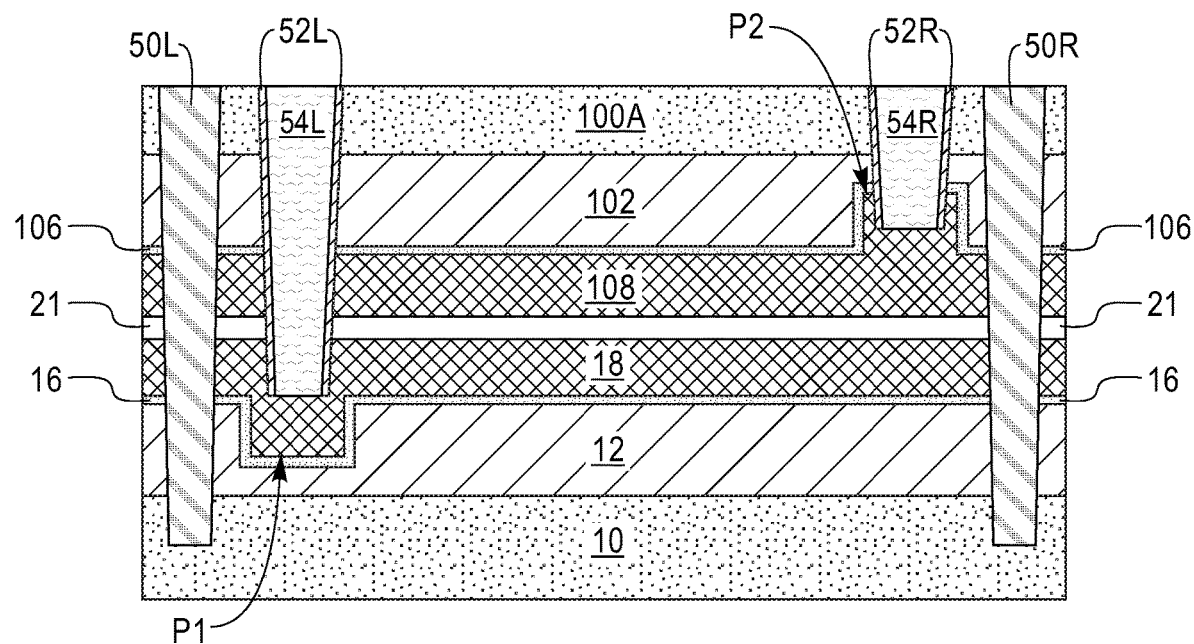

FIG. 9 is a cross sectional view of the exemplary bonded semiconductor structure of FIG. 10 after complete removal of the upper portion of the second semiconductor substrate that includes the hydrogen implant region.

FIG. 10 is a cross sectional view of the exemplary bonded semiconductor structure of FIG. 9 after forming, in any order, contact structures and trench isolation structures.

Figure 4:
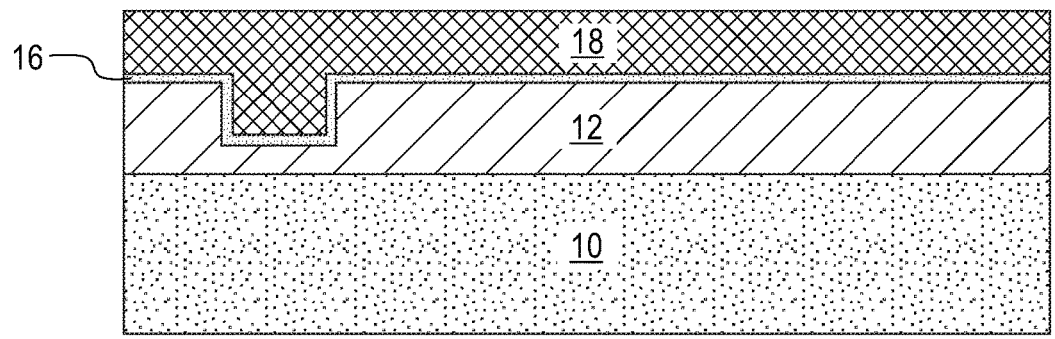
FIG. 4 is a cross sectional view of the exemplary semiconductor structure of FIG. 3 after forming a first refractory metal or metal alloy layer on the first metal-containing liner.
Figure 11:
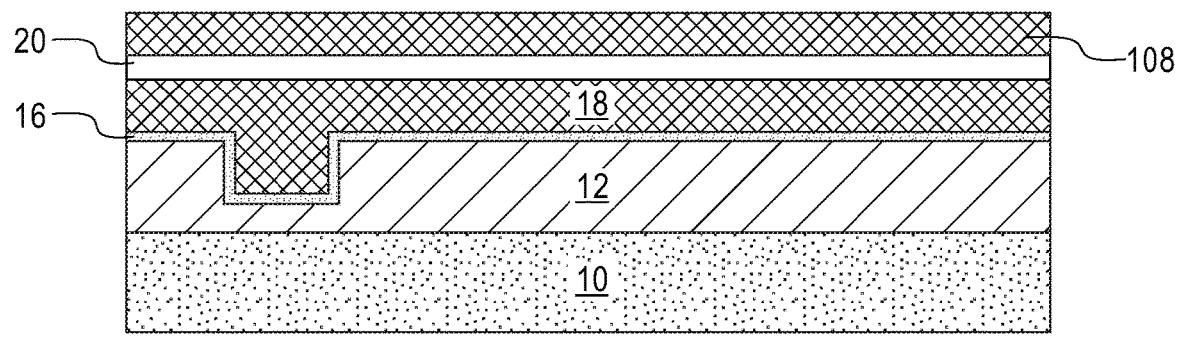

FIG. 11 is cross sectional view of the exemplary semiconductor structure of FIG. 4 after forming a first dielectric material layer on the first refractory metal or metal alloy layer, and a second refractory metal or metal alloy layer on the first dielectric material layer in accordance with another embodiment of the present application.

Figure 12:
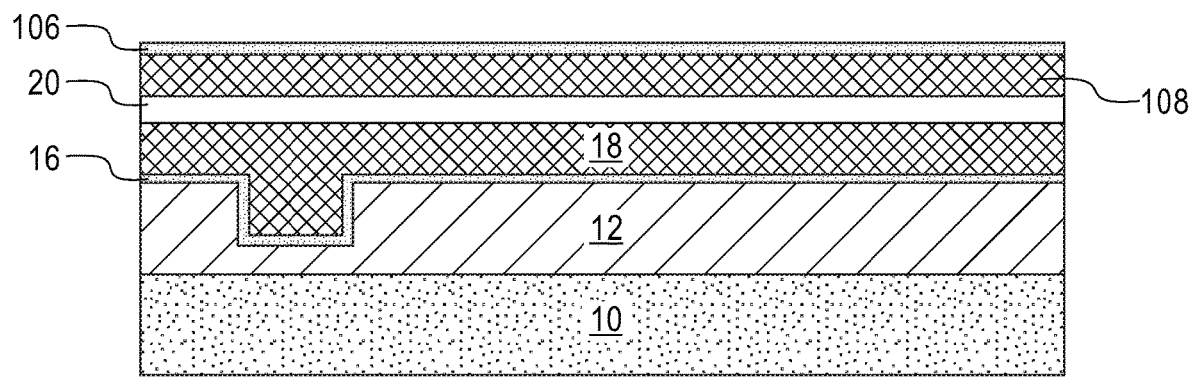

FIG. 12 is a cross sectional view of the exemplary semiconductor structure of FIG. 11 after forming a second metal-containing liner on the second refractory metal or metal alloy layer.

Figure 13:
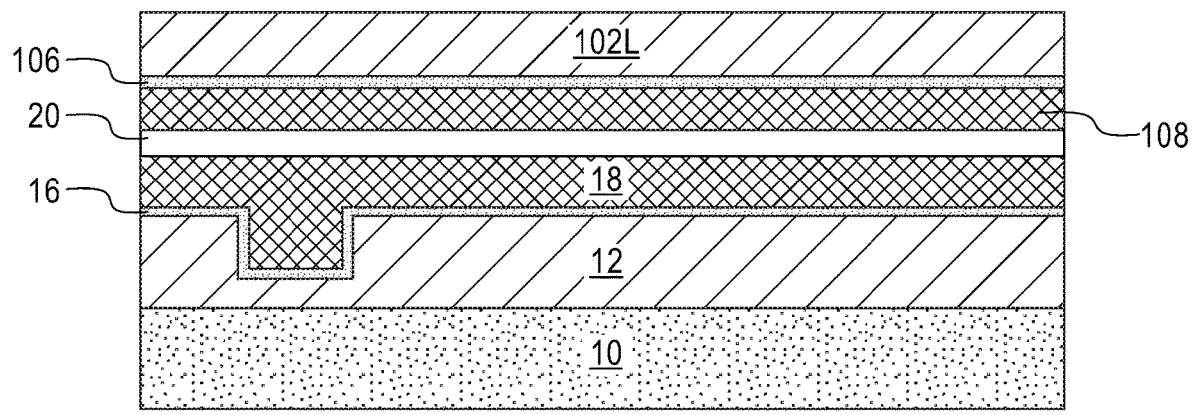

FIG. 13 is a cross sectional view of the exemplary semiconductor structure of FIG. 12 after forming an oxide layer on the second metal-containing liner.

Figure 14:
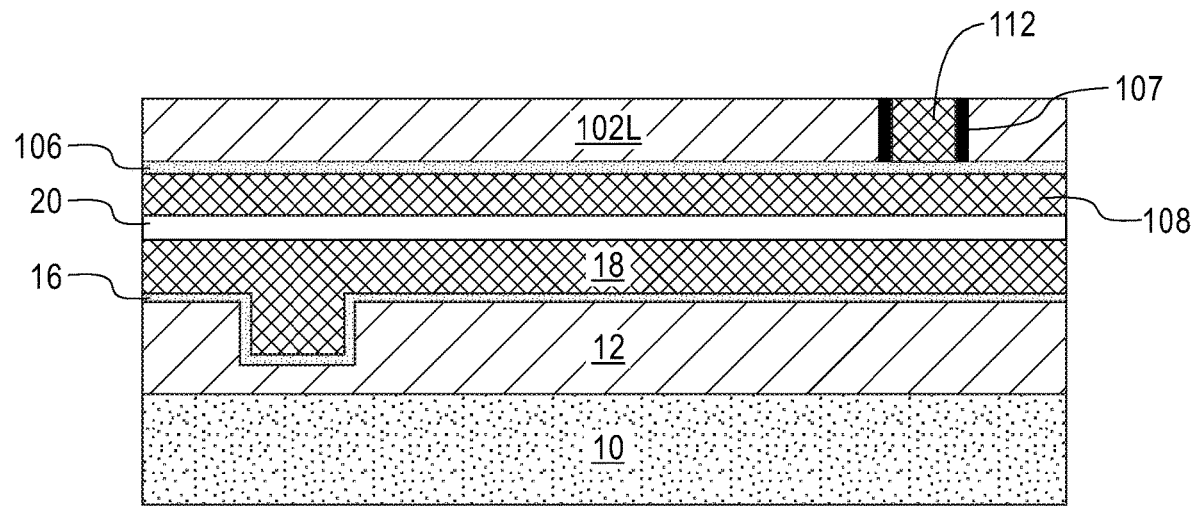

FIG. 14 is a cross sectional view of the exemplary semiconductor structure of FIG. 13 after forming an opening in the oxide layer, and forming metal-containing spacers and a refractory metal or metal alloy structure in the opening.

Figure 15:
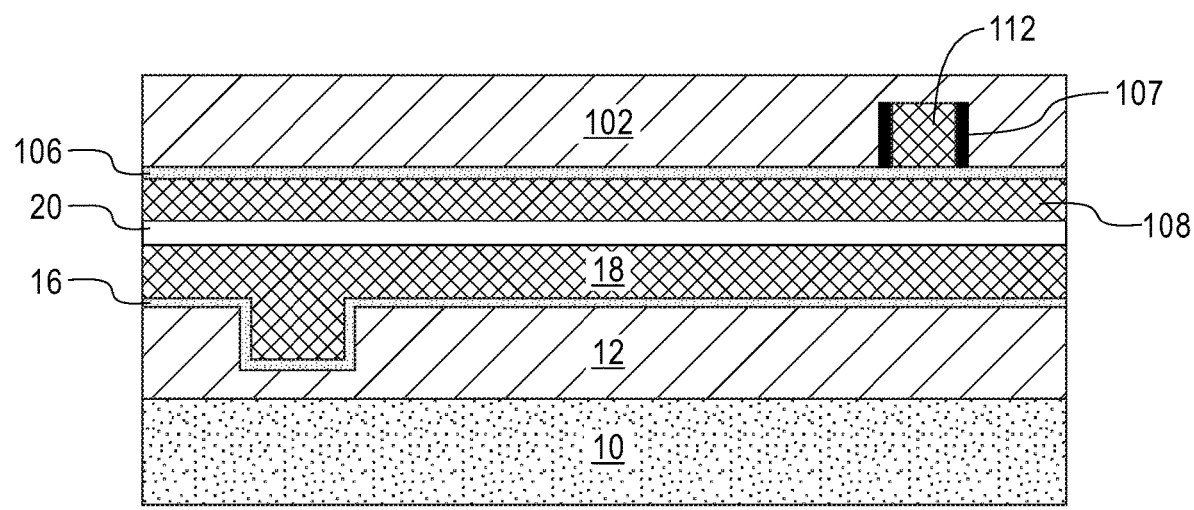

FIG. 15 is a cross sectional view of the exemplary semiconductor structure of FIG. 14 after forming additional oxide on the oxide layer.

Figure 16:
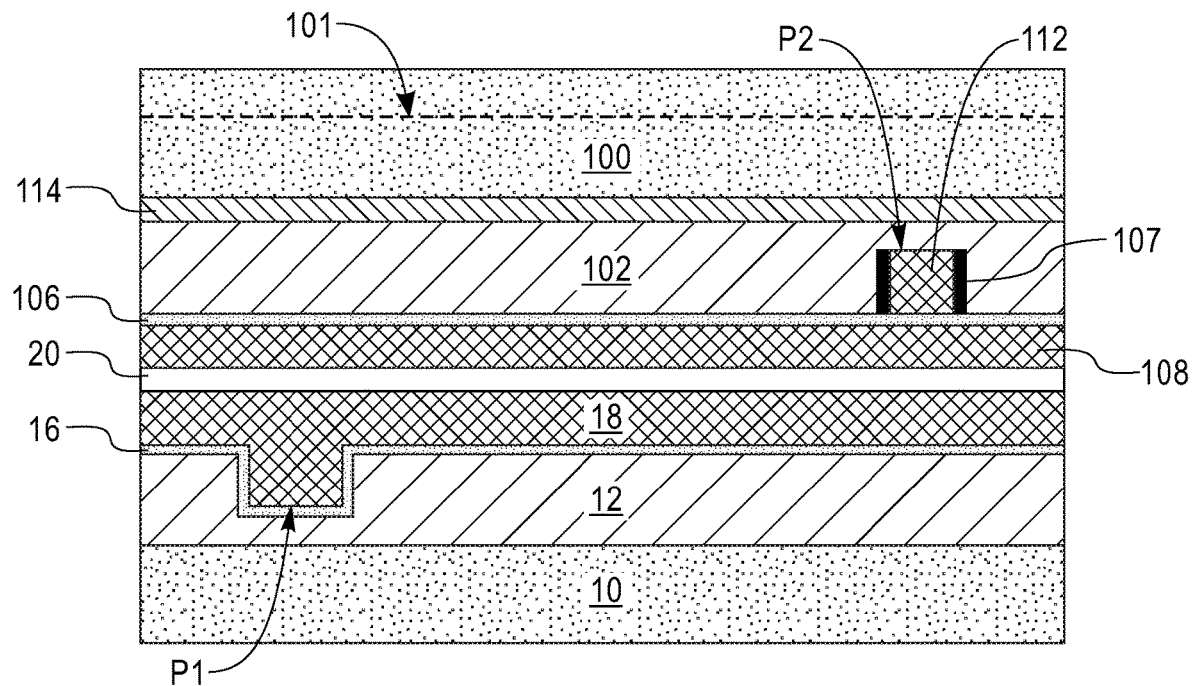

FIG. 16 is a cross sectional view of the exemplary semiconductor structure of FIG. 15 after bonding a second semiconductor substrate containing a hydrogen implant region to the additional oxide.

Figure 3:
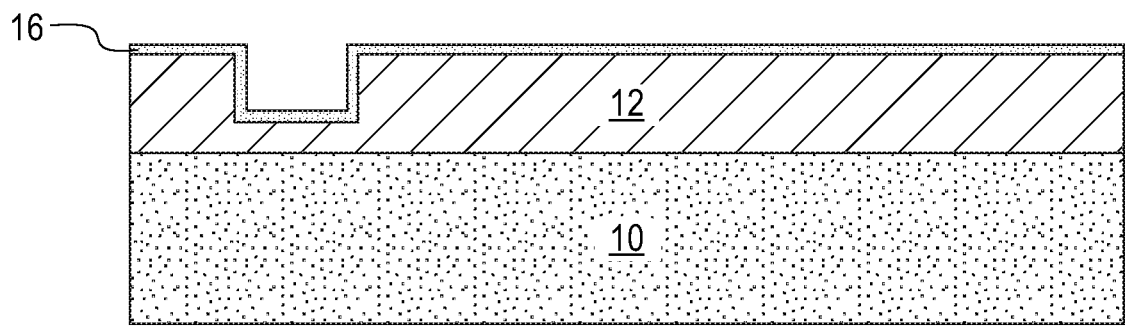
FIG. 3 is a cross sectional view of the exemplary semiconductor structure of FIG. 2 after forming a first metal-containing liner on the first oxide layer and within the opening.
Figure 17:
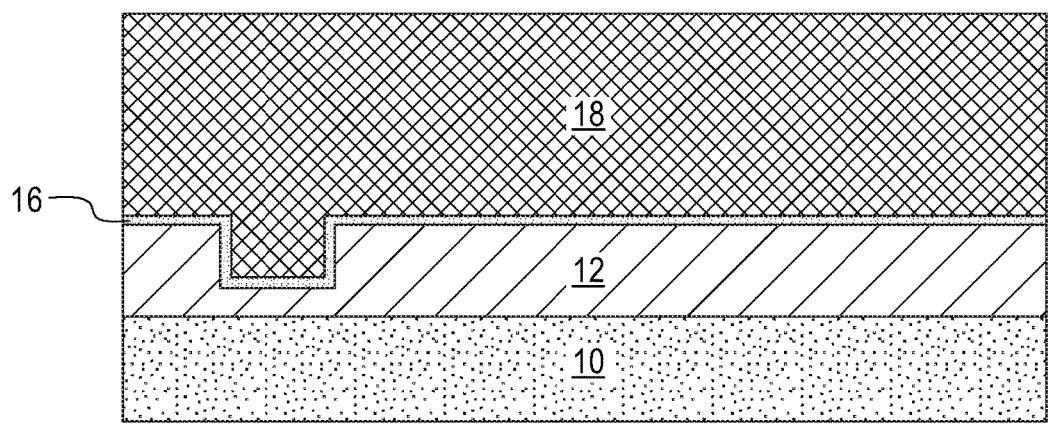

FIG. 17 is a cross sectional view of the exemplary semiconductor structure of FIG. 3 after forming a first refractory metal or metal alloy layer in accordance with another embodiment of the present application.

Figure 18:
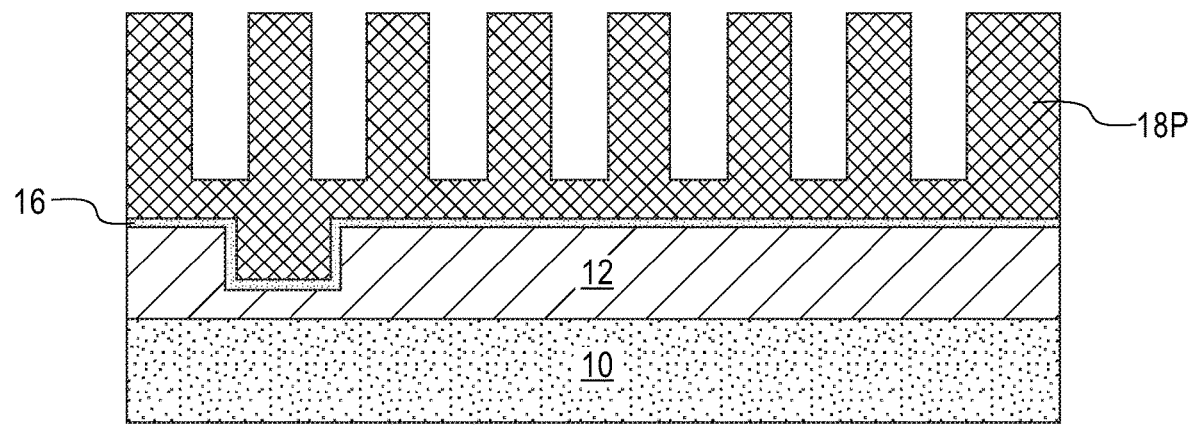

FIG. 18 is a cross sectional view of the exemplary semiconductor structure of FIG. 17 after patterning the first refractory metal or metal alloy layer to provide a patterned first refractory metal or metal alloy layer having a topography.

Figure 19:
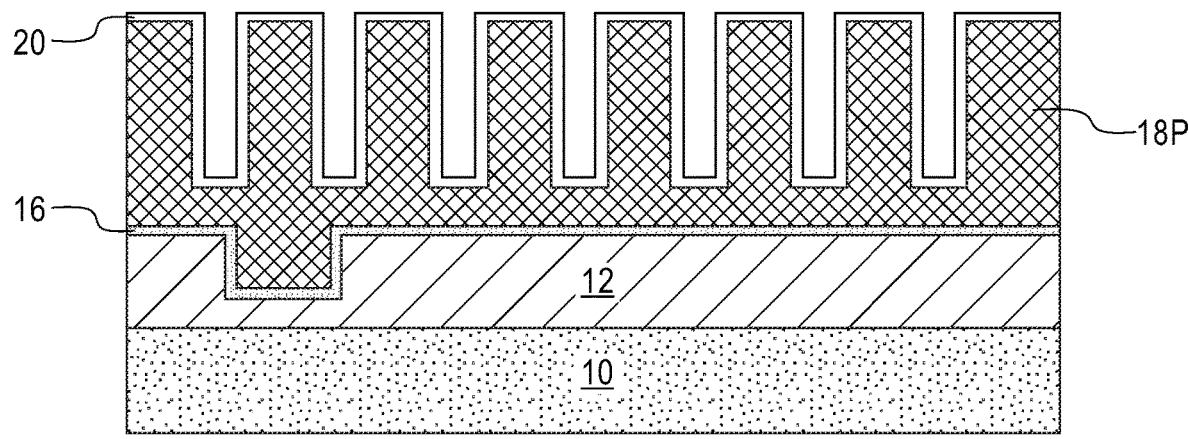

FIG. 19 is a cross sectional view of the exemplary semiconductor structure of FIG. 18 after forming a first dielectric material layer on the patterned first refractory metal or metal alloy layer.

Figure 20:
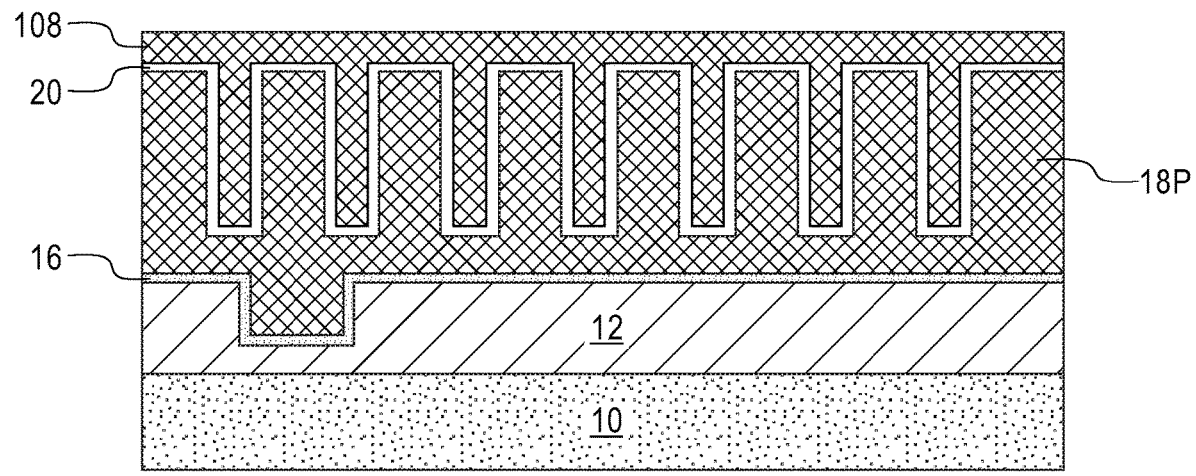

FIG. 20 is a cross sectional view of the exemplary semiconductor structure of FIG. 19 after forming a second refractory metal or metal alloy layer on the first dielectric material layer.

Figure 21:
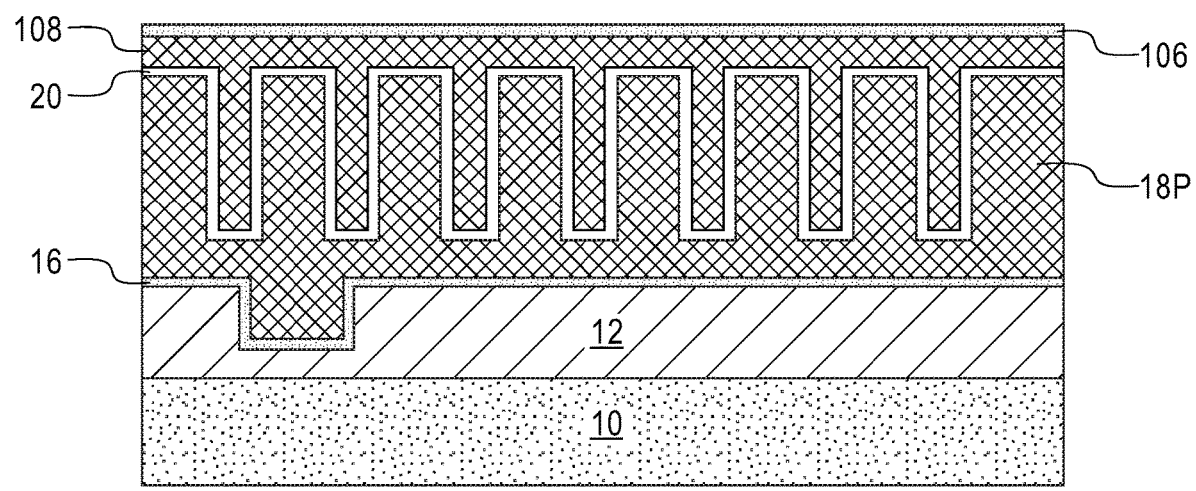

FIG. 21 is a cross sectional view of the exemplary semiconductor structure of FIG. 20 after forming a second metal-containing liner.

Figure 22:
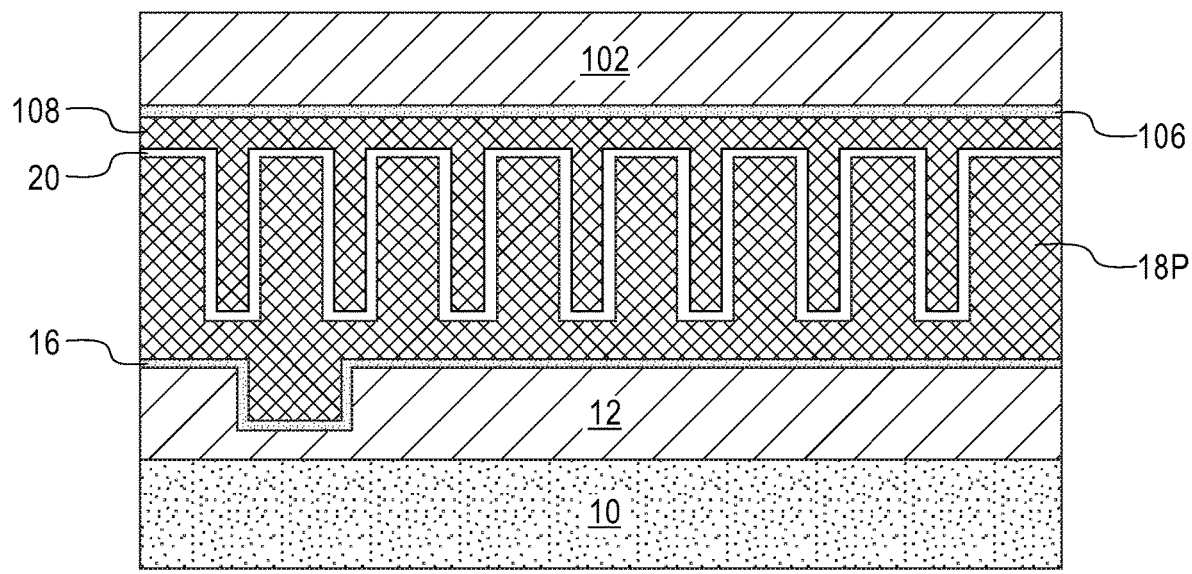

FIG. 22 is a cross sectional view of the exemplary semiconductor structure of FIG. 21 after forming an oxide layer.

Figure 23:
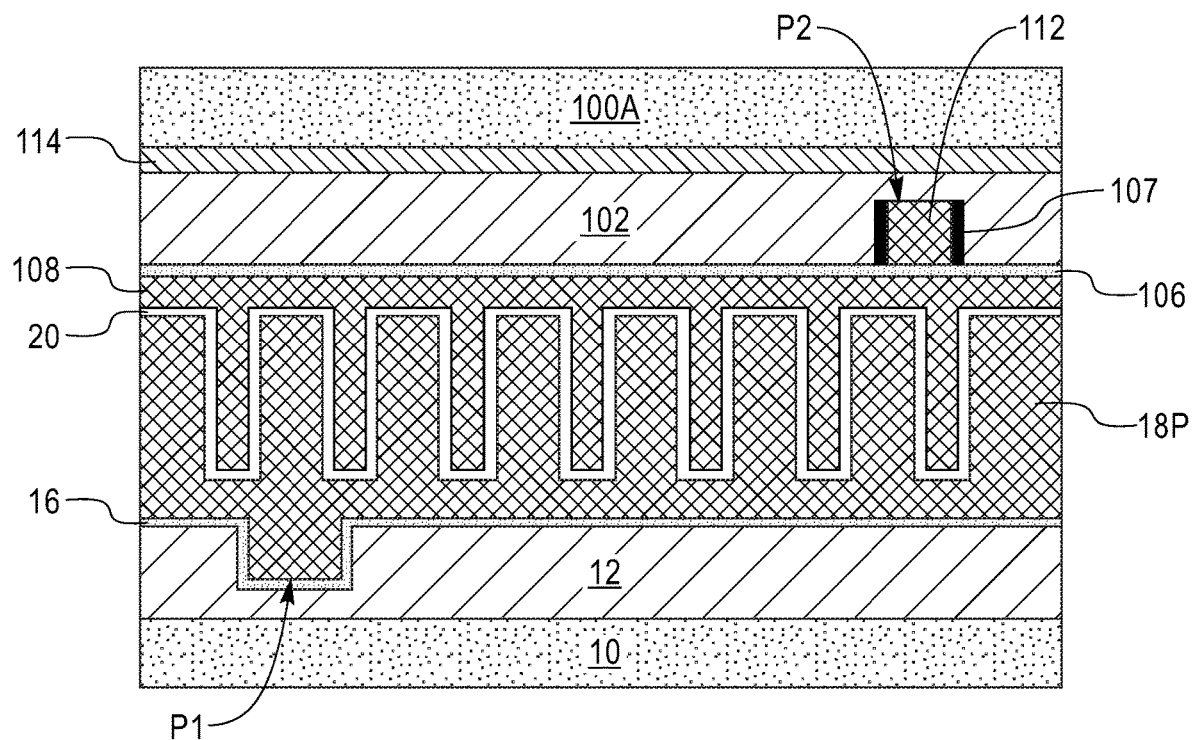

FIG. 23 is a cross sectional view of the exemplary semiconductor structure of FIG. 22 after forming an opening in the oxide layer, forming metal-containing spacers and a refractory metal or metal alloy structure in the opening, forming additional oxide, and bonding a second semiconductor substrate containing a hydrogen implant region to the additional oxide.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
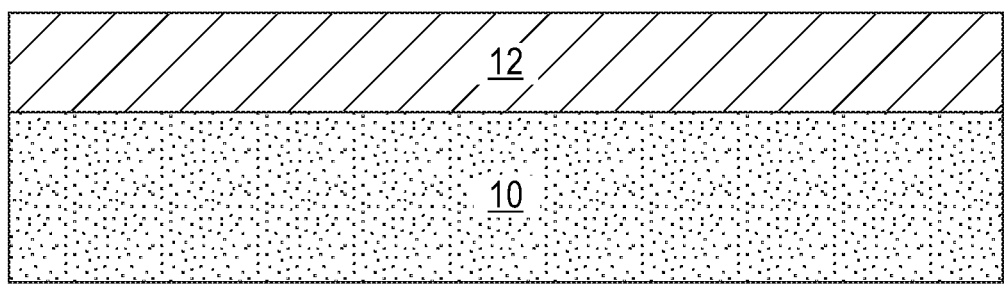
FIG. 1 is a cross sectional view of an exemplary semiconductor structure including a first oxide layer located on a surface of a first semiconductor substrate that can be employed in accordance with an embodiment of the present application.

Referring first to FIG. 1, there is illustrated an exemplary semiconductor structure that can be employed in accordance with an embodiment of the present application. The exemplary semiconductor structure of FIG. 1 includes a first oxide layer 12 located on a surface of a first semiconductor substrate 10.

The semiconductor substrate 10 that can be employed in the present application is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon. In some embodiments, the semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The first oxide layer 12 is a dielectric material such as, for example, a semiconductor oxide. In one embodiment, the semiconductor oxide may include silicon dioxide. In one embodiment, the first oxide layer 12 may be formed utilizing a deposition process such as, for example, chemical vapor deposition (CVD), plasma enhanced chemical vapor deposition (PECVD) or physical vapor deposition (PVD). In other embodiments, the first oxide layer 12 may be formed using a spin-on oxide process which also has self-leveling properties. In yet other embodiments, the first oxide layer 12 may be formed by a thermal oxidation process. The first oxide layer 12 can have a thickness from 50 nm to 1000 nm. Other thicknesses that are above or below the aforementioned thickness range may also be employed as the thickness of the first oxide layer 12.

Figure 2:
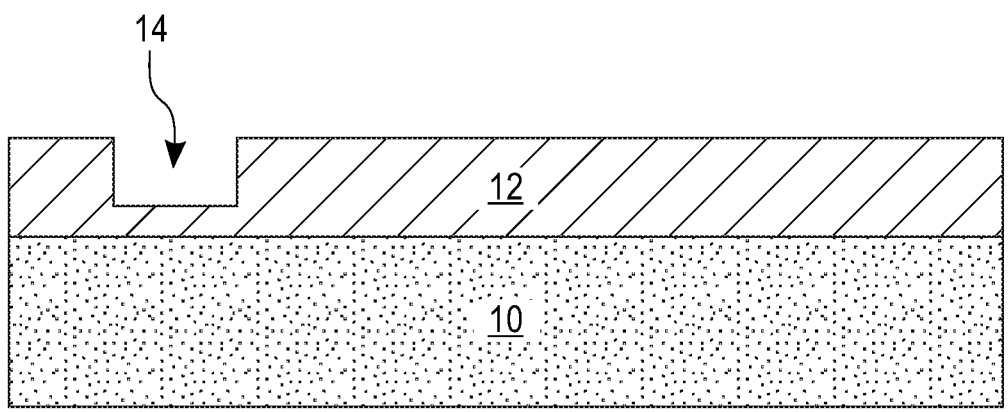
FIG. 2 is a cross sectional view of the exemplary semiconductor structure of FIG. 1 after forming an opening in the first oxide layer.

Referring now to FIG. 2, there is illustrated the exemplary semiconductor structure of FIG. 1 after forming an opening 14 in the first oxide layer 12. As is shown, the opening 14 is formed partially in, but not completely through, the first oxide layer 12. The opening 14 can be formed by lithography and etching. Lithography includes forming a photoresist material on a material to be patterned, exposing the photoresist material to a pattern of irradiation and then developing the exposed photoresist material. Etching may include a dry etching process such as, for example, reactive ion etching, or a wet chemical etching process. The opening 14 provides a region/area in which a landing pad will be subsequently formed.

Referring now to FIG. 3, there is illustrated the exemplary semiconductor structure of FIG. 2 after forming a first metal-containing liner 16 on the first oxide layer 12 and within the opening 14. The first metal-containing liner 16 is a continuous layer that is present on physically exposed surfaces of the first oxide layer 12. The first metal-containing liner 16 serves as a reaction and diffusion barrier. The first metal-containing liner 16 may be composed of Ru, RuTi, RuTa, RuNb, RuW, Ta, TaTi, TW, TaNb, TaMo, Ta/TiN, TaNbN, TaWN, TaMoN, Ti, TiN, TiTaN, W or WN. The first metal-containing liner 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The first metal-containing liner 16 may have a thickness from 0.5 nm to 20 nm. Other thickness are contemplated and can be employed in the present application as long as the first metal-containing liner 16 does not entirely fill the opening 14.

Referring now to FIG. 4, there is illustrated the exemplary semiconductor structure of FIG. 3 after forming a first refractory metal or metal alloy layer 18 on the first metal-containing liner 16. As is shown, the first refractory metal or metal alloy layer 18 completely fills in the opening 14 that is formed in the first oxide layer 12.

The first refractory metal or metal alloy layer 18 is composed of a metal or metal alloy that is extraordinarily resistant to heat. That is, the metal or metal alloy that provides the first refractory metal or metal alloy layer 18 has a melting point above 2000° C. Examples of metals or metal alloys that provide the first refractory metal or metal alloy layer 18 include niobium (Nb), molybdenum (Mo), tantalum (Ta), tungsten (W), rhenium (Re) or alloys thereof.

The first refractory metal or metal alloy layer 18 may be formed utilizing a deposition process such as, for example, chemical vapor deposition (CVD), atomic layer deposition (ALD), physical vapor deposition (PVD) or plating. In some embodiments, a chemical removal process such as, for example, chemical mechanical polishing may follow the deposition of the metal or metal alloy that provides the first refractory metal or metal alloy layer 18. The first refractory metal or metal alloy layer 18 may have a thickness from 20 nm to 100 nm. Other thicknesses are contemplated and can be employed in the present application.

Referring now to FIG. 5, there is illustrated the exemplary semiconductor structure of FIG. 4 after forming a first dielectric material layer 20 on the first refractory metal or metal alloy layer 18. The first dielectric material layer 20 is a continuous layer that covers an entirety of the underlying first refractory metal or metal alloy layer 18. In some embodiments, the first dielectric material layer 20 may be omitted.

The first dielectric material layer 20 that is employed in the present disclosure includes any dielectric material having electrically insulating properties and a dielectric constant that is equal to, or greater than, silicon dioxide. Dielectric materials having dielectric constants greater than silicon dioxide, which can also be used as first dielectric material layer 20, may be referred to as high k dielectric materials. In one embodiment, the first dielectric material layer 20 that can be employed in the present disclosure is a high k dielectric material having a dielectric constant of 8.0 or greater. In another embodiment, the first dielectric material layer 20 that can be employed in the present disclosure is a high k dielectric material having a dielectric constant of 10.0 or greater.

Exemplary dielectric materials that can be employed as first dielectric material layer 20 include, but are not limited to, silicon dioxide, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. Multilayered stacks of these dielectric materials can also be employed as the first dielectric material layer 20.

The first dielectric material layer 20 can be formed by a deposition process including, for example, chemical vapor deposition (CVD), plasma enhanced chemical vapor deposition (PECVD), physical vapor deposition (PVD), sputtering, or atomic layer deposition (ALD). In one embodiment of the present application, the first dielectric material layer 20 can have a thickness in a range from 1 nm to 10 nm. Other thicknesses that are lesser than, or greater than, the aforementioned thickness range can also be employed for the first dielectric material layer 20.

Referring now FIG. 6, there is illustrated another exemplary semiconductor structure will be subsequently bonded to the exemplary semiconductor structure shown in FIG. 5. The another exemplary semiconductor structure of FIG. 6 includes a second semiconductor substrate 100 having a hydrogen implant region 101 located therein, a second oxide layer 102 located on the second semiconductor substrate 100, the second oxide layer 102 having an opening therein, a second metal-containing liner 106 on the second oxide layer 102 and within the opening, a second refractory metal or metal alloy layer 108 on the second metal-containing liner 108 and a second dielectric material layer 110 located on the second metal-containing liner 108. In some embodiments of the present application, the second dielectric material layer 110 may be omitted. It is noted that at least one of the exemplary structures for bonding includes a dielectric material layer. In some embodiments, the hydrogen implant region 101 is optional.

The second semiconductor substrate 100 is a bulk semiconductor material as defined above. The second semiconductor substrate 100 may include one of the semiconductor materials mentioned above for the first semiconductor substrate. In one embodiment, the semiconductor material that provides the second semiconductor substrate 100 is composed of a same semiconductor material as that which provides the first semiconductor substrate 10. In another embodiment, the semiconductor material that provides the second semiconductor substrate 100 is composed of a different semiconductor material than that which provides the first semiconductor substrate 10.

The hydrogen implant region 101 is formed into the second semiconductor substrate 100 by implanting hydrogen ions into the second semiconductor substrate 100. The hydrogen ion implantation is typically performed after forming the second oxide layer 102, but prior to forming the second metal-containing liner 108. The hydrogen implant region 101 has a peak ion concentration that is located at a depth from 200 nm to 2000 nm below the upper surface of the second semiconductor substrate 100. The implant conditions can vary depending upon the thickness of the second semiconductor substrate 100. Typical implantation conditions used in forming the hydrogen implant region 101 are as follows: ion energy from 60 KeV to 250 KeV and a hydrogen ion dose from about 2E16 atoms/cm$^2$ to 5E16 atoms/cm$^2$.

The second oxide layer 102 includes one of the dielectric oxide materials mentioned above for the first oxide layer 12. The second oxide layer 102 may be composed of a same, or a different, dielectric oxide material as the first oxide layer 20. The second oxide layer 102 may be formed utilizing one of the techniques mentioned above in forming the first oxide layer 12. The second oxide layer 102 may have a thickness within the thickness range mentioned above for the first oxide layer 12. The opening that is provided in the second oxide layer 102 can be formed by lithography and etching, as defined above.

The second metal-containing liner 106 includes one of the metals or metal alloys mentioned above for the first metal-containing liner 16. The second metal-containing liner 106 may be composed of a same, or a different, metal or metal alloy as the first metal-containing liner 16. The second metal-containing liner 106 may be formed utilizing one of the techniques mentioned above in forming the first metal-containing liner 16. The second metal-containing liner 106 may have a thickness within the thickness range mentioned above for the first metal-containing liner 16.

The second refractory metal or metal alloy layer 108 includes one of the refractory metals or metal alloys mentioned above for the first refractory metal or metal alloy layer 18. The second refractory metal or metal alloy layer 108 may be composed of a same, or a different, refractory metal or metal alloy as the first refractory metal or metal alloy layer 18. The second refractory metal or metal alloy layer 108 may be formed utilizing one of the techniques mentioned above in forming the first refractory metal or metal alloy layer 18. The second refractory metal or metal alloy layer 108 may have a thickness within the thickness range mentioned above for the first refractory metal or metal alloy layer 18.

The second dielectric material layer 110 includes one of the dielectric materials mentioned above for the first dielectric material layer 20. The second dielectric material layer 110 may be composed of a same, or a different, dielectric material as the first dielectric material layer 20. The second dielectric material layer 110 may be formed utilizing one of the techniques mentioned above in forming the first dielectric material layer 20. The second dielectric material layer 110 may have a thickness within the thickness range mentioned above for the first refractory metal or metal alloy layer 20.

Referring now to FIG. 7, there is illustrated the exemplary semiconductor structures of FIGS. 5-6 after bonding the two exemplary structures together. The bonding of the two exemplary structures together includes flipping one of the exemplary structures 180°, bringing the two exemplary structures into intimate contact with each other, and performing a bonding anneal. An external pressure can be applied during and/or after the contact step.

The flipping of one of the two exemplary structures and the bringing them into intimate contact can be performed by hand or by mechanical means. In one embodiment and as shown, bonding occurs between the first and second dielectric material layers 20, 110. In another embodiment, bonding occurs between the dielectric material layer of one of the exemplary structures and the refractory metal or metal alloy layer of another of the exemplary structures.

In some embodiments, the intimate contacting may provide an initial bond between the two exemplary structures that is provided by a dielectric/dielectric interface or a dielectric/refractory metal or metal alloy interface. The intimate contacting may be performed at a temperature from 15° C. to 40° C. In some embodiments, bond strength can be enhanced by plasma activation of the oxide surfaces before bonding.

The bonding anneal is performed at a temperature that is relatively low so as to prevent hydrogen induced crack propagation in the hydrogen implant region 101 from occurring prior to bond strengthen which is achieved during the bonding anneal. In one embodiment, the bonding anneal is performed at a temperature from 200° C. to 350° C. The bonding anneal may be performed for a time period from 2 hours to 24 hours The bonding annealing can be performed in an inert ambient including helium, nitrogen, argon, neon and/or krypton. Alternatively, a forming gas which includes a mixture of nitrogen and hydrogen can be employed. The bonding anneal may be performed at a single targeted temperature utilizing a single ramp up rate, or various ramp and soak cycles using various ramp rates and soak times can be employed.

Referring now to FIG. 8, there is illustrated the exemplary bonded semiconductor structure of FIG. 7 during the removal of an upper portion 100B of the second semiconductor substrate 100 that includes the hydrogen implant region 101. The remaining portion of the second semiconductor substrate 100 may be referred to a semiconductor material device layer 100A. The semiconductor material device layer 100A may have a thickness from 5 nm to 100 nm. In embodiments in which no hydrogen implant region 101 is present in the second semiconductor substrate 100, a material removal process such as, for example, chemical mechanical polishing and/or grinding may be employed. A wet etch process is another example of a material removal process that can be used in the present application to remove an upper portion 100B of the second semiconductor substrate 100.

The removal of the upper portion 100B of the second semiconductor substrate 100 is performed utilizing a splitting anneal that is performed at a higher temperature than the bonding anneal described above so as to allow a hydrogen induced Oswald ripen effect to occur, i.e., to form a crack in the second semiconductor substrate 100 at the plane of the hydrogen implant region 101. That is, this splitting anneal is performed at a temperature that forms a crack at the hydrogen implant region 101 which is capable of separating, i.e., splitting, a portion of the second semiconductor substrate 100 from the bonded structures. A razor blade or other like means can be used to aid in the separation process.

In one embodiment, the splitting anneal is performed at a temperature from 475° C. to 550° C. In some embodiments, the splitting anneal may be performed for a time period from 4 hours to 6 hours. This splitting anneal can be performed in one of the above mentioned ambients and various heating regimes including different ramp up rates, soak cycles and cool down rates can be employed.

Referring now to FIG. 9, there is illustrated the exemplary bonded semiconductor structure of FIG. 10 after complete removal of the upper portion 100B of the second semiconductor substrate 100 that includes the hydrogen implant region 101. One or more semiconductor devices such as, for example, transistors may be processed on or within the semiconductor material device layer 100A. In FIG. 9, element P1 denotes a first landing pad, while element P2 denotes a second landing pad. The landing pads, P1, P2, are composed of the refractory metal or metal alloy that is located within each opening that was formed into the oxide layers. The first and second dielectric layers 20, 110 may collectively be referred to herein as a capacitor insulator material layer 21.

Referring now to FIG. 10, there is illustrated the exemplary bonded semiconductor structure of FIG. 9 after forming, in any order, contact structures and trench isolation structures 50L, 50R; 50L may be referred to as a first trench isolation structure, and 50R may be referred to as a second trench isolation structure. Each contact structures may include a diffusion barrier liner 52L, 52R and a contact metal or metal alloy structure 54L, 54R. Each of the contact structures contacts a surface of one of the landing pads, P1, P2. Elements 52L, 54L define a first contact structure, while elements 52R, 54R define a second contact structure. The first and second contact structures may be devoid of the diffusion barrier liner.

The contact structures can be formed by providing a contacting opening that extends from a topmost surface of the semiconductor material device layer 100A to a surface of one of the underlying landing pads, P1, P2. The contact openings can be formed by lithography and etching. A diffusion barrier layer can then be optionally formed into each of the contact openings. The diffusion barrier layer may be composed of any diffusion barrier material such as, for example, Ti, TiN, Ta or Ta/TaN. A sputter etch may be employed to remove the diffusion barrier layer from the surface of the landing pads, P1, P2. A contact metal or metal alloy such as, for example, copper, aluminum, cobalt, tungsten or a copper-aluminum alloy is then formed into each contact opening. A planarization process may follow so as to provide diffusion barrier liners 52L, 52R and contact metal or metal alloy structures 54L, 54R in their respective contact openings.

Trench isolation structures 50L, 50R can be formed by lithography and etching to provide isolation trenches in the structure. The isolation trenches can be filled with a trench dielectric material such as, for example, silicon dioxide. A densification process and/or a planarization process may follow the trench fill process.

Collectively, the first refractory metal or metal alloy layer 18, the capacitor insulator material layer 21, and the second refractory metal or metal alloy layer 108 that is provided between neighboring trench isolation structures 50L, 50R provide a buried MIM capacitor of the present application with landing pads P1, P2. The capacitance of the buried MIM capacitor can adjusted by varying the distance between the neighboring trench isolation structures 50L, 50R.

FIG. 10 illustrates an exemplary semiconductor structure of the present application. The exemplary semiconductor structure includes a first oxide layer 12 located on a semiconductor substrate 10. A metal-insulator-metal (MIM) capacitor (18/21/108) is located on the first oxide layer 12. The MIM capacitor (18/21/108) comprises a first refractory metal or metal alloy layer 18, a dielectric material layer 21, and a second refractory metal or metal alloy layer 108. A second oxide layer 102 is located on the MIM capacitor (18/21/108). A semiconductor material device layer 100A is located on the second oxide layer 102. In accordance with the present application the first oxide layer 12 includes a first landing pad, P1, embedded therein, and the second oxide layer 102 includes a second landing pad, P2, embedded therein.

The first and second landing pads, P1, P2 are composed of a refractory metal or metal alloy. In this embodiment, the first landing pad, P1, is composed of a same refractory metal or metal alloy as the first refractory metal or metal alloy layer 18, while the second landing pad, P2, is composed of a same refractory metal or metal alloy as the second refractory metal or metal alloy layer 108. In this embodiment, the first landing pad, P1, is in direct physical contact with the first refractory metal or metal alloy layer 18, and the second landing pad is in direct physical contact with the second refractory metal or metal alloy layer 108.

Referring now to FIG. 11, there is illustrated the exemplary semiconductor structure of FIG. 4 after forming a first dielectric material layer 20 on the first refractory metal or metal alloy layer 18, and a second refractory metal or metal alloy layer 108 on the first dielectric material layer 20 in accordance with another embodiment of the present application.

The first dielectric material layer 20 of this embodiment includes one of the dielectric materials mentioned previous for the first dielectric material layer 20. The first dielectric material layer 20 of this embodiment can be formed utilizing one of the techniques mentioned above in forming the first dielectric material layer 20. The first dielectric material layer 20 has a thickness that is generally thicker than in the embodiment illustrated previously. Notably, the first dielectric material layer 20 of this embodiment can have the combined thickness of the first and second dielectric material layers 20, 110 of the previous embodiment of the present application.

The second refractory metal or metal alloy layer 108 of this embodiment is the same as that in the previous embodiment of the present application except that the second refractory metal or metal alloy layer 108 is formed directly upon the first dielectric material layer 20 utilizing one of the deposition processes previous mentioned above for forming the first refractory metal or metal alloy layer 18.

Referring now to FIG. 12, there is illustrated the exemplary semiconductor structure of FIG. 11 after forming a second metal-containing liner 106 on the second refractory metal or metal alloy layer 108. The second metal-containing liner 106 of this embodiment is the same as that in the previous embodiment of the present application except that the second metal-containing liner 106 is formed directly upon the second refractory metal or metal alloy layer 108 utilizing one of the deposition processes previous mentioned above for forming the first metal-containing liner 16.

Referring now to FIG. 13, there is illustrated the exemplary semiconductor structure of FIG. 12 after forming an oxide layer 102L on the second metal-containing liner 106. The oxide layer 102L of this embodiment is the same as the second oxide layer 102 of the previous embodiment of the present application except that the oxide layer 102L is formed directly upon the second metal-containing liner 106 utilizing one of the deposition processes previous mentioned above for forming the first oxide layer 12.

Referring now to FIG. 14, there is illustrated the exemplary semiconductor structure of FIG. 13 after forming an opening (not shown) in the oxide layer 102L, and forming metal-containing spacers 107 and a refractory metal or metal alloy structure 112 in the opening. The opening can be formed by lithography and etching, as defined above. Next, a metal-containing layer is formed into the opening and a spacer etch can be used to remove a portion of the metal-containing layer along the bottom of the opening to provide the metal-containing spacers 107. The metal-containing layer and thus the metal-containing spacers 107 include a same metal or metal alloy as the second metal-containing liner 106 mentioned above.

Next, a refractory metal or metal alloy layer is formed into the opening and thereafter a planarization process can be employed to provide the refractory metal or metal alloy structure 112. The refractory metal or metal alloy that provides the refractory metal or metal alloy structure 112 is composed of one of the refractory metals or metal alloys mentioned above for the first refractory metal or metal alloy layer 18. The refractory metal or metal alloy that provides the refractory metal or metal alloy structure 112 may be composed of a refractory metal or metal alloy that is the same or different from the refractory metal or metal alloy that provides either the first or second refractory metal or metal alloy layers 18, 108. The refractory metal or metal alloy layer may be formed by utilizing one of the deposition processed mentioned above for forming the first refractory metal or metal alloy layer 18.

Referring now to FIG. 15, there is illustrated the exemplary semiconductor structure of FIG. 14 after forming additional oxide on the oxide layer 102L. The additional oxide layer is typically the same oxide as the oxide layer 102L. Collectively, the additional oxide layer and the oxide layer 102L may be referred to as the second oxide layer 102. The additional oxide layer is formed atop the metal-containing spacers 107 and the refractory metal or metal alloy structure 112 that was previously formed into the opening provided in the oxide layer 102L. The additional oxide layer can be formed utilizing one of the techniques mentioned above in forming the first oxide layer 12.

Referring now to FIG. 16, there is illustrated the exemplary semiconductor structure of FIG. 15 after bonding a second semiconductor substrate 100 containing a hydrogen implant region 101 to the additional oxide, i.e., to a topmost surface of the second oxide layer 102. In some embodiments, the second semiconductor substrate 100 may include an oxide layer 114 thereon such that an oxide-to-oxide bonding interface is formed. In another embodiment, oxide layer 114 may be omitted and a semiconductor-to-oxide bonding interface may be formed. In some embodiments, no hydrogen implant region 101 is present in the second semiconductor substrate 100.

The second semiconductor substrate 100 includes materials and can be formed as described above in the previous embodiment of the present application. Hydrogen implant region 101 can be formed as described above. Bonding may be performed utilizing the bonding process mentioned above, i.e., flipping one of the structures 180°, bringing the two structures into intimate contact with each other and then performing a bonding anneal.

The exemplary structure shown in FIG. 16 may then be subjected to the splitting anneal mentioned above (or any other material removal process) to remove an upper portion of the second semiconductor substrate 100, and thereafter trench isolation structures and contact structures as defined above can be formed. The contact structures will contact surfaces of the landing pads P1, P2.

After performing these steps another exemplary semiconductor structure is provided that includes a first oxide layer 12 located on a semiconductor substrate 10. A metal-insulator-metal (MIM) capacitor (18/20/108) is located on the first oxide layer 12. The MIM capacitor (18/20/108) comprises a first refractory metal or metal alloy layer 18, a dielectric material layer 20, and a second refractory metal or metal alloy layer 108. A second oxide layer 102 is located on the MIM capacitor (18/20/108). A semiconductor material device layer (i.e., remaining portion of 100) is located on the second oxide layer 102. In accordance with the present application the first oxide layer 12 includes a first landing pad, P1, embedded therein, and the second oxide layer 102 includes a second landing pad, P2, embedded therein.

The first and second landing pads P1, P2 are composed of a refractory metal or metal alloy. In this embodiment, the first landing pad, P1, is composed of a same refractory metal or metal alloy as the first refractory metal or metal alloy layer 18, while the second landing pad, P2, is composed of a refractory metal or metal alloy that may or may not be the same as the second refractory metal or metal alloy layer 108. In this embodiment, the first landing pad, P1, is in direct physical contact with the first refractory metal or metal alloy layer 18, and the second landing pad spaced apart from the second refractory metal or metal alloy layer 108.

Referring now to FIG. 17, there is illustrated the exemplary semiconductor structure of FIG. 3 after forming a first refractory metal or metal alloy layer 18 in accordance with another embodiment of the present application. In this embodiment, a larger area MIM capacitor is provided composed to the MIM capacitors formed in the previously embodiments of the present application.

The first refractory metal or metal alloy layer 18 of this embodiment of the present application is the same as the previous embodiments except that the thickness of the first refractory metal or metal alloy layer 18 of this embodiment is much greater than in the other embodiments of the present application. In one example, the first refractory metal or metal alloy layer 18 of this embodiment may have a thickness from 2 nm to 10 nm.

Referring now to FIG. 18, there is illustrated the exemplary semiconductor structure of FIG. 17 after patterning the first refractory metal or metal alloy layer 18 to provide a patterned first refractory metal or metal alloy layer 18P having a topography. The patterning of the first refractory metal or metal alloy layer 18 may be performed utilizing lithography and etching, a sidewall-image transfer process or a directed self-assembly process. In some embodiments, the patterned first refractory metal or metal alloy layer 18P contains a plurality of vertical pillars or fins that extend upwards from a base portion of the patterned first refractory metal or metal alloy layer 18P. A gap may be present between the vertical pillars (i.e., fins) as shown in FIG. 18.

Referring now to FIG. 19, there is illustrated the exemplary semiconductor structure of FIG. 18 after forming a first dielectric material layer 20 on the patterned first refractory metal or metal alloy layer 18P. The first dielectric material layer 20 includes dielectric materials and thicknesses as mentioned above in the first embodiment of the present application, see, for example, FIG. 5 and related text.

Referring now to FIG. 20, there is illustrated the exemplary semiconductor structure of FIG. 19 after forming a second refractory metal or metal alloy layer 108 on the first dielectric material layer 20. The second refractory metal or metal alloy layer 108 of this embodiment is the same as that in the first embodiment of the present application except that the second refractory metal or metal alloy layer 108 is formed directly upon the first dielectric material layer 20 utilizing one of the deposition processes previous mentioned above for forming the first refractory metal or metal alloy layer 18. In some embodiments, a planarization process may follow the deposition of the refractory metal or metal alloy that provides the second refractory metal or metal alloy layer 108.

Referring now to FIG. 21, there is illustrated the exemplary semiconductor structure of FIG. 20 after forming a second metal-containing liner 106 on the second refractory metal or metal alloy layer 108. The second metal-containing liner 106 of this embodiment is the same as that in the first embodiment of the present application except that the second metal-containing liner 106 is formed directly upon the second refractory metal or metal alloy layer 108 utilizing one of the deposition processes previous mentioned above for forming the first metal-containing liner 16.

Referring now to FIG. 22, there is illustrated the exemplary semiconductor structure of FIG. 21 after forming an oxide layer 102L. The oxide layer 102L of this embodiment is the same as the second oxide layer 102 of the first embodiment of the present application except that the oxide layer 102L is formed directly upon the second metal-containing liner 106 utilizing one of the deposition processes previous mentioned above for forming the first oxide layer 12.

Referring now to FIG. 23, there is illustrated the exemplary semiconductor structure of FIG. 22 after forming an opening (not shown) in the oxide layer 102L, forming metal-containing spacers 107 and a refractory metal or metal alloy structure 112 in the opening, forming additional oxide, and bonding a second semiconductor substrate 100 containing a hydrogen implant region 101 to the additional oxide. The opening can be formed by lithography and etching, as defined above. Next, a metal-containing layer is formed into the opening and a spacer etch can be used to remove a portion of the metal-containing layer along the bottom of the opening to provide the metal-containing spacers 107. The metal-containing layer and thus the metal-containing spacers 107 include a same metal or metal alloy as the second metal-containing liner 106 mentioned above.

Next, a refractory metal or metal alloy layer is formed into the opening and thereafter a planarization process can be employed to provide the refractory metal or metal alloy structure 112. The refractory metal or metal alloy that provides the refractory metal or metal alloy structure 112 is composed of one of the refractory metals or metal alloys mentioned above for the first refractory metal or metal alloy layer 18. The refractory metal or metal alloy that provides the refractory metal or metal alloy structure 112 may be composed of a refractory metal or metal alloy that is the same or different from the refractory metal or metal alloy that provides either the first or second refractory metal or metal alloy layers 18, 108. The refractory metal or metal alloy layer may be formed by utilizing one of the deposition processed mentioned above for forming the first refractory metal or metal alloy layer 18.

Next, the additional oxide layer is formed on oxide layer 102 and atop the metal-containing spacers 107 and the refractory metal or metal alloy structure 112. The additional oxide layer is typically the same oxide as the oxide layer 102L. Collectively, the additional oxide layer and the oxide layer 102L may be referred to as the second oxide layer 102. The additional oxide layer is formed atop the metal-containing spacers 107 and the refractory metal or metal alloy structure 112 that was previously formed into the opening provided in the oxide layer 102L. The additional oxide layer can be formed utilizing one of the techniques mentioned above in forming the first oxide layer 12.

A second semiconductor substrate 100 containing a hydrogen implant region 101 is then provided and bonded to the additional oxide, i.e., to a topmost surface of the second oxide layer 102. In some embodiments, the second semiconductor substrate 100 may include an oxide layer 114 thereon such that an oxide-to-oxide bonding interface is formed. In another embodiment, oxide layer 114 may be omitted and a semiconductor-to-oxide bonding interface may be formed. In some embodiments, the hydrogen implant region 101 is omitted from the second semiconductor substrate 100.

The second semiconductor substrate 100 containing a hydrogen implant region 101 includes materials and can be formed as described above in the previous embodiment of the present application. Bonding may be performed utilizing the bonding process mentioned above, i.e., flipping one of the structures 180°, bringing the two structures into intimate contact with each other and then performing a bonding anneal.

The exemplary structure shown in FIG. 23 may then be subjected to the splitting anneal mentioned above (or any other material removal process) to remove an upper portion of the second semiconductor substrate 100, and thereafter trench isolation structures and contact structures as defined above can be formed. The contact structures will contact surfaces of the landing pads P1, P2.

After performing these steps another exemplary semiconductor structure is provided that includes a first oxide layer 12 located on a semiconductor substrate 10. A metal-insulator-metal (MIM) capacitor (18/20/108) is located on the first oxide layer 12. The MIM capacitor (18/21/108) comprises a first refractory metal or metal alloy layer 18, a dielectric material layer 20, and a second refractory metal or metal alloy layer 108. A second oxide layer 102 is located on the MIM capacitor (18/20/108). A semiconductor material device layer (i.e., remaining portion of 100) is located on the second oxide layer 102. In accordance with the present application the first oxide layer 12 includes a first landing pad, P1, embedded therein, and the second oxide layer 102 includes a second landing pad, P2, embedded therein.

The first and second landing pads P1, P2 are composed of a refractory metal or metal alloy. In this embodiment, the first landing pad, P1, is composed of a same refractory metal or metal alloy as the first refractory metal or metal alloy layer 18, while the second landing pad, P2, is composed of a refractory metal or metal alloy that may or may not be the same as the second refractory metal or metal alloy layer 108. In this embodiment, the first landing pad, P1, is in direct physical contact with the first refractory metal or metal alloy layer 18, and the second landing pad P2 is spaced apart from the second refractory metal or metal alloy layer 108.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   providing a first structure comprising a first oxide layer located on a surface of a first semiconductor substrate, the first oxide layer having an opening located therein, and a first refractory metal-containing layer located above the first oxide layer and filling the opening;
   providing a second structure comprising a second semiconductor substrate, a second oxide layer having an opening located therein, and a second refractory metal-containing layer located above the second oxide layer and filling the opening, wherein a dielectric material layer is present on at least one of the first refractory metal-containing layer and the second refractory metal-containing layer;
   bonding the first structure and the second structure together such that the second semiconductor substrate has a physically exposed surface;
   removing a portion of the second semiconductor substrate; and
   forming first and second trench isolation structures extending from a topmost surface of a remaining portion of the second semiconductor substrate and contacting a surface of the first semiconductor substrate.

2. The method of claim 1, wherein an area between the first and second trench isolation structures defines a metal-insulator-metal (MIM) capacitor comprising the first refractory metal-containing layer, the dielectric material layer and the second refractory metal-containing layer.

3. The method of claim 1, wherein the first refractory metal-containing layer in the opening in the first oxide layer defines a first landing pad, and the second refractory metal-containing layer in the second opening defines a second landing pad.

4. The method of claim 3, further comprising forming a first contact structure extending from the topmost surface of a remaining portion of the second semiconductor substrate and contacting a surface of the first landing pad, and a second contact structure extending from the topmost surface of the remaining portion of the second semiconductor substrate and contacting a surface of the second landing pad.

5. The method of claim 1, wherein the opening located in the first oxide layer extends partially into the first oxide layer.

6. The method of claim 1, further comprising forming a first metallic-containing liner on the first oxide layer and within the opening prior to forming the first refractory metal-containing layer above the first oxide layer and in the opening.

7. The method of claim 1, wherein the dielectric material layer is located on the first refractory metal-containing layer.

8. The method of claim 1, wherein the opening located in the second oxide layer extends partially into the first oxide layer.

9. The method of claim 6, further comprising forming a second metallic-containing liner on the second oxide layer and within the opening prior to forming the second refractory metal-containing layer above the second oxide layer and in the opening.

10. The method of claim 1, wherein the dielectric material layer is located on the second refractory metal-containing layer.

11. The method of claim 1, wherein the bonding is performed at a temperature from 200° C. to 350° C.

12. The method of claim 1, wherein the first refractory metal-containing layer is composed of niobium (Nb), molybdenum (Mo), tantalum (Ta), tungsten (W), rhenium (Re) or alloys thereof.

13. The method of claim 1, wherein the second refractory metal-containing layer is composed of niobium (Nb), molybdenum (Mo), tantalum (Ta), tungsten (W), rhenium (Re) or alloys thereof.

14. A method of forming a semiconductor structure, the method comprising:
   providing a first structure comprising a first oxide layer located on a surface of a first semiconductor substrate, the first oxide layer having an opening located therein, a first refractory metal-containing layer located above the first oxide layer and filling the opening, and a first dielectric material layer located on the first refractory metal-containing layer;
   forming a second refractory metal-containing layer on the first dielectric material layer;
   forming a second oxide layer above the second refractory metal-containing layer, wherein the second oxide layer has a refractory metal-containing structure embedded therein;
   providing a second structure comprising a second semiconductor substrate;
   bonding the first structure and the second structure together;
   removing a portion of the second semiconductor substrate; and
   forming first and second trench isolation structures extending from a topmost surface of a remaining portion of the second semiconductor substrate and contacting a surface of the first semiconductor substrate.

15. The method of claim 14, wherein an area between the first and second trench isolation structures defines a metal-insulator-metal (MIM) capacitor comprising the first refractory metal-containing layer, the first dielectric material layer and the second refractory metal-containing layer.

16. The method of claim 14, wherein the first refractory metal-containing layer in the opening in the first oxide layer defines a first landing pad, and the refractory metal-containing structure in the second oxide layer defines a second landing pad.

17. The method of claim 16, further comprising forming a first contact structure extending from the topmost surface of a remaining portion of the second semiconductor substrate and contacting a surface of the first landing pad, and a second contact structure extending from the topmost surface of the remaining portion of the second semiconductor substrate and contacting a surface of the second landing pad.

18. The method of claim 14, wherein the opening located in the first oxide layer extends partially into the first oxide layer.

19. The method of claim 14, further comprising forming a first metallic-containing liner on the first oxide layer and within the opening prior to forming the first refractory metal-containing layer above the first oxide layer and in the opening.

20. The method of claim 14, wherein the first refractory metal-containing layer and the second refractor metal-containing layer are composed of niobium (Nb), molybdenum (Mo), tantalum (Ta), tungsten (W), rhenium (Re) or alloys thereof.

\* \* \* \* \*